US012604782B2

(12) United States Patent
Nielsen et al.

(10) Patent No.: US 12,604,782 B2
(45) Date of Patent: Apr. 14, 2026

(54) MOLDED CONTRAST MASK FOR DISPLAY MODULE

(71) Applicant: Daktronics, Inc., Brookings, SD (US)

(72) Inventors: Ryan Joseph Nielsen, Volga, SD (US); Gregory Lynn Rauen, Brookings, SD (US); Matthew Craig Buisker, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 18/344,517

(22) Filed: Jun. 29, 2023

(65) Prior Publication Data

US 2023/0343762 A1 Oct. 26, 2023

Related U.S. Application Data

(63) Continuation of application No. 16/870,397, filed on May 8, 2020, now abandoned.

(60) Provisional application No. 62/845,555, filed on May 9, 2019.

(51) Int. Cl.
| | |
|---|---|
| *H01L 25/075* | (2006.01) |
| *H10H 20/85* | (2025.01) |
| *H10H 20/857* | (2025.01) |

(52) U.S. Cl.
CPC ..... *H01L 25/0753* (2013.01); *H10H 20/8506* (2025.01); *H10H 20/857* (2025.01)

(58) Field of Classification Search
CPC ............. H01L 2933/005; H01L 33/483; H01L 33/486; H01L 33/52; H01L 33/54; H01L 33/56; H10H 20/8506; H10H 20/857; H10H 20/852; H10H 20/853; H10H 20/854
See application file for complete search history.

(56) References Cited

U.S. PATENT DOCUMENTS

| | | | |
|---|---|---|---|
| 2012/0025227 A1 | 2/2012 | Chan et al. | |
| 2017/0288108 A1* | 10/2017 | Schumann | ............... A23B 2/40 |
| 2017/0309223 A1* | 10/2017 | Deeman | ................... H05K 3/28 |
| 2020/0357776 A1 | 11/2020 | Nielsen et al. | |

FOREIGN PATENT DOCUMENTS

| | | |
|---|---|---|
| CN | 108010938 | 5/2018 |
| DE | 102016105491 A1 | 9/2017 |
| WO | WO-2020227627 A2 | 11/2020 |

OTHER PUBLICATIONS

"U.S. Appl. No. 16/870,397, Examiner Interview Summary mailed Dec. 27, 2022", 2 pgs.
"U.S. Appl. No. 16/870,397, Final Office Action mailed Mar. 30, 2023", 11 pgs.

(Continued)

*Primary Examiner* — Raj R Gupta
(74) *Attorney, Agent, or Firm* — Schwegman Lundberg & Woessner, P.A.

(57) ABSTRACT

A display module comprises a circuit board, a plurality of light-emitting elements coupled to a front surface of the circuit board and arranged in an array configured to produce at least a portion of a display image at the front surface of the circuit board, and a contrast mask directly coupled to the front surface of the circuit board, the contrast mask defining a plurality of windows, with each window surrounding a group of one or more of the plurality of light-emitting elements.

19 Claims, 6 Drawing Sheets

(56) References Cited

OTHER PUBLICATIONS

"U.S. Appl. No. 16/870,397, Final Office Action mailed May 25, 2022", 7 pgs.

"U.S. Appl. No. 16/870,397, Non Final Office Action mailed Feb. 16, 2022", 7 pgs.

"U.S. Appl. No. 16/870,397, Non Final Office Action mailed Sep. 15, 2022", 8 pgs.

"U.S. Appl. No. 16/870,397, Response filed Jan. 7, 2022 to Restriction Requirement mailed Nov. 18, 2021", 5 pgs.

"U.S. Appl. No. 16/870,397, Response filed Mar. 15, 2023 to Non Final Office Action mailed Sep. 15, 2022", 11 pgs.

"U.S. Appl. No. 16/870,397, Response filed May 16, 2022 to Non Final Office Action mailed Feb. 16, 2022", 8 pgs.

"U.S. Appl. No. 16/870,397, Response filed Aug. 25, 2022 to Final Office Action mailed May 25, 2022", 10 pgs.

"U.S. Appl. No. 16/870,397, Restriction Requirement mailed Nov. 18, 2021", 6 pgs.

"Australian Application Serial No. 2020267677, First Examination Report mailed Nov. 3, 2022", 3 pgs.

"European Application Serial No. 20733075.4, Response to Communication pursuant to Rules 161(1) and 162 EPC filed Jun. 27, 2022", 29 pgs.

"International Application Serial No. PCT/US2020/032093, International Preliminary Report on Patentability mailed Nov. 18, 2021", 9 pgs.

"International Application Serial No. PCT/US2020/032093, International Search Report mailed Oct. 30, 2020", 4 pgs.

"International Application Serial No. PCT/US2020/032093, Written Opinion mailed Oct. 30, 2020", 7 pgs.

"Chinese Application Serial No. 202080043598.6, Office Action mailed Jan. 29, 2026", w English Translation, 14 pgs.

* cited by examiner

MOLDED CONTRAST MASK FOR DISPLAY MODULE

CROSS-REFERENCE TO RELATED APPLICATION

This application is a continuation of U.S. patent application Ser. No. 16/870,397, filed May 8, 2020, which application claims the benefit of priority to U.S. Provisional Patent Application Ser. No. 62/845,555 entitled "MOLDED CONTRAST MASK FOR DISPLAY MODULES," filed May 9, 2019, the disclosures of which are incorporated by reference herein in their entireties.

BACKGROUND

Displays comprising a plurality of light-emitting elements are used to display one or more of textual, graphical, or video information. In some applications, such as digital billboards or scoreboards, individual display modules are connected to one or more support structures and operated collectively to form a larger display. Displays can be operated in outdoor applications where bright sunlight can occasionally interfere with the appearance of the textual, graphical, or video information.

SUMMARY

The present disclosure describes a display comprising one or more display modules arranged to produce a display image comprising textual, graphical or video information. Each display module includes a contrast mask that is directly coupled to the front surface of a circuit board of the display module so as to provide for improved contrast for the display, particular in direct sunlight. In an example, each display module includes a plurality of light-emitting elements arranged in groups of pixels, wherein a pixel pitch between adjacent pixels is no more than about 4 millimeters, and in some examples is no more than 2.5 millimeters, and the contrast mask is molded directly to the front surface of the circuit board to form windows that each surround one or more pixels of the display module.

BRIEF DESCRIPTION OF THE FIGURES

The drawings illustrate generally, by way of example, but not by way of limitation, various embodiments discussed in the present document.

DETAILED DESCRIPTION

Figure 1:
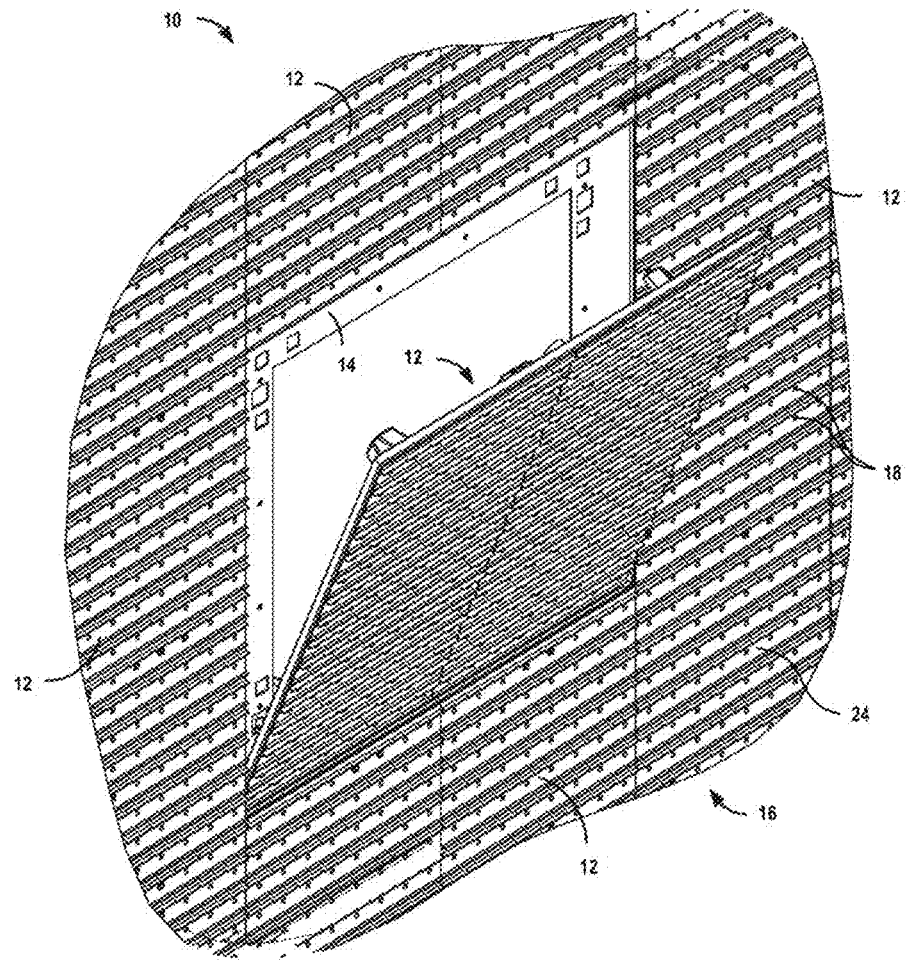
FIG. 1 is a partial perspective view of an example display comprising a plurality of individual display modules that are operated in a cooperative manner to display information on the light-emitting display.

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The example embodiments may be combined, other embodiments may be utilized, or structural, and logical changes may be made without departing from the scope of the present invention. While the disclosed subject matter will be described in conjunction with the enumerated claims, it will be understood that the exemplified subject matter is not intended to limit the claims to the disclosed subject matter. The following detailed description is, therefore, not to be taken in a limiting sense, and the scope of the present invention is defined by the appended claims and their equivalents.

References in the specification to "one embodiment", "an embodiment," "an example embodiment," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" should be interpreted to include not only the explicitly recited concentration of about 0.1 wt. % to about 5 wt. %, but also the individual concentrations (e.g., 1%, 2%, 3%, and 4%) and the sub-ranges (e.g., 0.1% to 0.5%, 1.1% to 2.2%, and 3.3% to 4.4%) within the indicated range.

In this document, the terms "a," "an," or "the" are used to include one or more than one unless the context clearly dictates otherwise. The term "or" is used to refer to a nonexclusive "or" unless otherwise indicated. Unless indicated otherwise, the statement "at least one of" when referring to a listed group is used to mean one or any combination of two or more of the members of the group. For example, the statement "at least one of A, B, and C" can have the same meaning as "A; B; C; A and B; A and C; B and C; or A, B, and C," or the statement "at least one of D, E, F, and G" can have the same meaning as "D; E; F; G; D and E; D and F; D and G; E and F; E and G: F and G; D, E, and F; D, E, and G; D, F, and G; E, F, and G; or D, E, F, and G." A comma can be used as a delimiter or digit group separator to the left or right of a decimal mark; for example, "0.000.1"" is equivalent to "0.0001."

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y,"" unless indicated otherwise. Likewise, the statement "about X, Y, or about Z" has the same meaning as "about X, about Y, or about Z," unless indicated otherwise.

The term "about" as used herein can allow for a degree of variability in a value or range, for example, within 10%, within 5%, within 1%, within 0.5%, within 0.10%, within 0.05%, within 0.01%, within 0.005%, or within 0.001% of a stated value or of a stated limit of a range, and includes the exact stated value or range.

The term "direction" used herein can refer to, unless otherwise specified, to a linear direction for the purposes of describing or characterizing a physical location of a particular structure, for example to describe the physical location of one structure relative to another structure. In some specific examples, the term "direction" is used to refer to one or more reference directions for the purposes of describing or characterizing relative positioning of one structure relative to another. For example, a common set of reference directions that is well known to those of skill in the art are the directions used to describe three-dimensional Euclidean space, and in particular the directions associated with each axis of a three-dimensional Cartesian coordinate system. As will be appreciated by those having skill in the art, Cartesian coordinates are often used to define positions within a three-dimensional space by defining three imaginary reference axes, typically named the "x-axis," the "y-axis," and the "z-axis," which are pairwise perpendicular. These axes can also be used to define a "direction" associated with each axis, referred to herein as an "x-direction" defined as a linear direction that is parallel to the x-axis (but not necessarily coincident with the x-axis), a "y-direction" defined as a linear direction that is parallel to the y-axis (but not necessarily coincident with the y-axis), and a "z-direction" defined as a linear direction that is parallel to the z-axis (but not necessarily coincident with the z-axis).

The term "substantially" as used herein refers to a majority of, or mostly, such as at least about 50%, 60%, 70%, 80%, 90%, 95%, 96%, 97%, 98%, 99%, 99.5%, 99.9%, 99.99%, or at least about 99.999% or more, or 100%.

In addition, it is to be understood that the phraseology or terminology employed herein, and not otherwise defined, is for the purpose of description only and not of limitation. Any use of section headings is intended to aid reading of the document and is not to be interpreted as limiting, and information that is relevant to a section heading may occur within or outside of that particular section. All publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods described herein, the acts can be carried out in any order without departing from the principles of the disclosed method, except when a temporal or operational sequence is explicitly recited. Furthermore, specified acts can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first and steps B, C, D, and E can be carried out in any sequence between steps A and E, and that the sequence still falls within the literal scope of the claimed process. A given step or sub-set of steps may also be repeated.

Electronic Display

FIG. 1 shows an example of an information display 10 (also referred to simply as "display 10") that is configured to display one or more of graphics, video, or text. For the sake of brevity, this disclosure will refer to the information that is presented on the display 10 as a "display image." However, those of skill in the art will appreciate that the display 10 is not limited solely to a graphical image or a static image, and will understand any recitation of a "display image" as referring to one or any combination of display graphical information (e.g., an image intended to represent a real or imaginary object of concept), video information (e.g., a series of two or more images displayed in succession so as to imitate motion), or textual information (e.g., letters, numbers, symbols, or other characters intended to represent language or other communication) being presented on the display 10 during the same period of time. The display 10 includes one or more individual display modules 12 mounted to one or more supports, such as a support chassis 14 (also referred to as a frame 14).

In some examples, the display 10 described herein is configured for relatively large-scale display of one or more display images to a relatively large number of viewers, such as a video display for a large venue such as a sports stadium or arena or a large music concert arena or venue, or a display on a digital or video billboard display. In an example, either a display module 12 or the support chassis 14, or both, includes a mounting structure or apparatus at one or more locations relative each display module 12 to mount or couple each display module 12 to the support chassis 14, such as one or more latches. FIG. 1 shows one of the display modules 12 being in a tilted position relative to the support chassis 14, which can occur when that display module 12 is in the process of being mounted to, or dismounted from, the support chassis 14. The other display modules 12 in the display 10 have already been mounted to the support chassis 14, such as with one or more latches or other mounting hardware. In examples wherein the display 10 is formed from a plurality of the display modules 12, the plurality of display modules 12 operate together so that the overall display 10 appears as a single, larger display surface 16. The display 10 can be configured to display the display image on the display surface 16. A plurality of light-emitting elements 18 are mounted to the display surface 16. For example, each of light-emitting elements 18 can be mounted to one or more mounting structures of a corresponding display module 12, such as one or more of a circuit board, potting, or a module frame. In such an example, the light-emitting elements 18 are controlled in a cooperative manner so that the display 10 shows the display image on the display surface 16.

The light-emitting elements 18 can be any type of light-emitting technology known or yet to be discovered for the emission of light from a small area, e.g., so that from a distance the light from any particular light-emitting element 18 will appear to be a small point of light. As described in more detail below, in some examples each light-emitting element 18 is small enough such that it can cooperate with one or more additional light-emitting elements 18 in an area small enough so as to appear as an individual pixel, e.g., that will appear as a single discrete point of light, which can itself cooperate with a plurality of other pixels to form a visual representation of the display image being displayed on the display surface 16. In particular, the light-emitting elements 18 can be of any type of light-emitting technology that is or can be used for the display of visual information, such as video information, graphical information, or textual information. At the time of filing of the present application, light-emitting diodes (LEDs) are one of the most common light-emitting technologies in use for video or graphical displays of the type described herein. As such, for the sake of brevity, the remainder of the present disclosure will refer to light-emitting elements that can be used in a display, including the light-emitting elements 18 shown in the figures, will be referred to as LEDs 18. Those of skill in the art will appreciate, however, that any time the present disclosure uses the term "light-emitting element," "light-emitting diode" or "LED," it is referring not only to LEDs, as they are understood at the time of filing, but also refers to other light-emitting technologies and devices, including, but not limited to, liquid crystal display devices (LCDs), organic light-emitting diodes (OLEDs), light-emitting transistor devices (LETs), organic light-emitting transistors (OLETs), surface-conduction electron-emitter display devices (SEDs), field-emission display devices (FEDs), quantum dot display devices such as quantum dot liquid crystal display devices (QD-LCDs) or quantum dot light-emitting diode display devices (QD-LEDs), ferro-liquid display devices (FLDs), and thick-film dielectric electroluminescent devices (TDELs).

Figure 2:
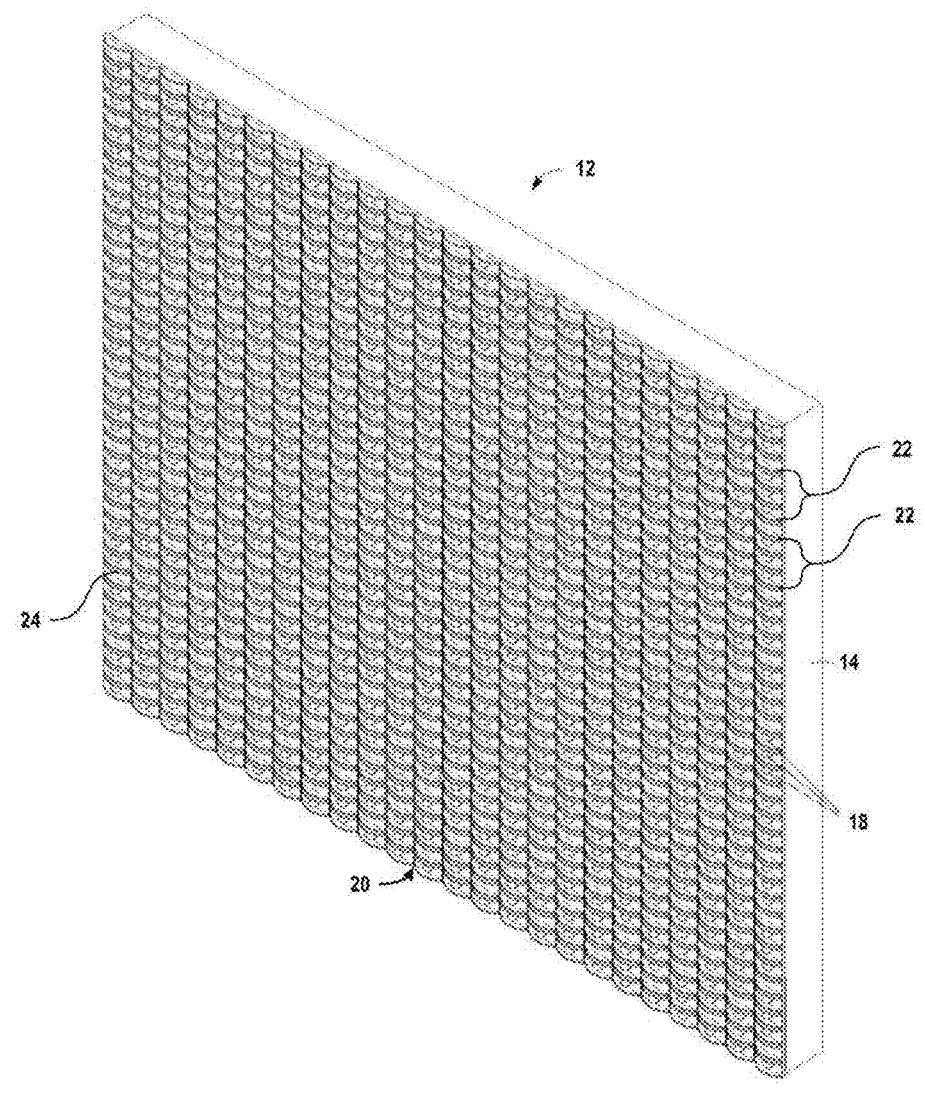
FIG. 2 is a perspective view of an example display module, which can be used as one of the individual display modules in the example display of FIG. 1.

FIG. 2 is a perspective view of an example display module 12 that can be used in the display 10 of FIG. 1. The display module 12 includes a front face 20 configured to provide for a display visual content. A plurality of the LEDs 18 are positioned on the front face 20 and the LEDs 18 can be operated in such a way that the display module 12 will display at least a portion of the display image (e.g., at least a portion of the overall video, graphic, or text that is to be shown on the display 10 as the display image). The front face 20 of the display module 12 is aligned and oriented relative to front faces 20 of one or more adjacently positioned display modules 12 so that the front faces 20 combine and cooperatively form the overall display surface 16 of the full display 10 (shown in FIG. 1). The plurality of display modules 12 are operated together in such a way as to display the display image in a cohesive manner so that the entire display 10 appears to a viewer as a single display that is larger than the individual display modules 12.

In an example, the LEDs 18 are arranged into an array of pixels 22 (best seen in FIG. 2). Each pixel 22 includes one or more LEDs 18 grouped together in close proximity. The proximity of the pixels 22 allows the display 10 to be operated in such a way that they will appear to a viewer of the display 10 to form recognizable shapes, such as letters or numbers to display textual information or recognizable geometries to display graphical or video information. In some examples, the plurality of LEDs 18 include a plurality of different-colored LEDs 18 in each of the pixels 22 that can be cooperatively operated to display what appears to be a spectrum of different colors for the viewer of the display 10, e.g., using an additive color method. In a common example, each pixel 22 includes a red LED 18, a green LED 18, and a blue LED 18, wherein the red, green, and blue LEDs of each pixel 22 cooperate to provide essentially the entire color spectrum that is visible to humans based on whether one, two, or all three of the LEDs 18 in a pixel 22 are lit, and at what intensities. Those of skill in the art will appreciate that other combinations of specific colors of LEDs 18 can be selected for each pixel 22, depending on the specific colors and performance desired for the display 10. The display 10 can also provide a black or empty looking surface over a portion of the display, when desired, by deactivating or turning off the LEDs in a designated area of pixels 22.

In the example shown in FIG. 2, each pixel 22 includes a plurality of LEDs 18 arranged in a specified pixel shape. The example of FIG. 2 shows a linear or substantially linear pixel shape comprising three LEDs 18 (e.g., corresponding to the red LED 18, green LED 18, and blue LED 18 discussed above) that are aligned or substantially aligned in a common direction, such as in the vertically aligned pixel shape of the pixels 22 shown in FIG. 2. Those of skill in the art will appreciate that pixel shapes other than a vertical or substantially vertical pixel 22 can be used, including, but not limited to: a linear or substantially linear pixel oriented in a direction other than vertical (e.g., a horizontal or substantially horizontal pixel shape or a diagonal linear pixel shape), or geometrical pixel shapes with one or more LEDs at each vertex of a specified geometrical shape (such as a triangular pixel formed from three LEDs, a quadrilateral pixel formed from four LEDs, and so on).

In an example, the pixels 22 are arranged in a grid-like array, such as a grid including a specified number of rows and a specified number of columns of the pixels 22 that are spaced by a specified spacing distance. In some examples, the specified spacing between adjacent pixels 22, also referred to as the "pixel spacing" or the "pixel pitch," is uniform or substantially uniform throughout the entirety of the display surface 16. In some examples, each row of pixels 22 is spaced from adjacent rows on either side by the specified uniform or substantially uniform pixel pitch, and similarly each column of pixels 22 is spaced from adjacent columns on either side by the same specified uniform or substantially uniform pixel pitch. Uniform or substantially uniform pixel spacing provides for display images with geometries that appear to be solid or uniform shapes for a view of the display 10 and can add to the realism of the display image for the viewer and/or fidelity to the desired content to be displayed on the display 10.

The size of the pixel pitch can be selected depending on the size of the display 10 (e.g., a total surface area of the display surface 16, which can also be described according to the length of the display surface 16 along one or more defined directions, such as a width of the display 10 in a first direction, such as a horizontal or substantially horizontal direction, and a height of the display in a second direction that is generally perpendicular to the first direction, such as a vertical direction), the distance that is expected between the display 10 and viewers of the display 10, and the specified resolution selected for the display 10. As used herein, the term "resolution" refers to the total number of pixels 22 in the display in one or more of the defined directions, such as in the first direction (e.g., the horizontal or substantially horizontal direction corresponding to the width of the display 10) or the second direction (e.g., the vertical or substantially vertical direction corresponding to the height of the display 10), or both. "Resolution" can also be defined in terms of a pixel density, such as a specified number of pixels per unit of area or per unit of length in one or more of the defined directions. Those of skill in the art will appreciate that the pixel density of a display is inversely related to the pixel pitch—e.g., as the pixel pitch gets smaller and smaller, the pixel density gets larger and larger.

In some examples, described in more detail below, the LEDs 18 are provided in the form of a plurality of discrete electronic devices, sometimes referred to as LED packages. In an example, each LED package includes one or more LEDs 18 and at least a portion of the supporting electronics for lighting and controlling the one or more LEDs 18. Depending on the size of the specified pixel pitch, each LED package can be configured for an individual LED 18 (in which case a pixel 22 comprising a plurality of the LEDs 18 would be made up of an equal number of LED packages) or each pixel 22 can be made up of its own LED package (in which case the LED package would include all of the LEDs 18 that are part of the pixel 22 as well as supporting electronics for those LEDs 18).

In an example, the display 10 is controlled with control software and/or one or more hardware controllers, so that the display image is broken down into coordinates. Each coordinate can correspond to a specific pixel location within the overall display 10, and the control software and/or the one or more hardware controllers can operate each pixel according to a program that specifies a condition for each coordinate within the display 10 and controls each of the pixels 22 so that it will appear to emit light that meets the condition specified. For example, if the display 10 is displaying a series of display images (either to appear as static images, or to appear as a moving video), the control software and/or the one or more hardware controllers can be fed the data corresponding to the series of display images, and the control software and/or the one or more hardware controllers can break the series of display images down into conditions for each pixel 22—such as the time within the series of messages, the color hue that a pixel 22 is to display at that time, the color saturation that the pixel 22 is to display at that time, and the intensity of the pixel 22 at that time. The control software and/or the one or more hardware controllers can also convert the information regarding color (e.g., hue and saturation) and intensity into specific operating parameters for each LED 18 in a particular pixel 22, such as the power that will be supplied to the red LED 18, the blue LED 18, and the green LED 18 in that pixel 22 and for how long in order to achieve the specified color and intensity at the specified time. The control software and/or the one or more hardware controllers can then send control signals to the pixels 22 or to individual LEDs 18, e.g., to the LED package or packages associated with each pixel 22, to operate each pixel 22 according to the specified series of display images. Although a grid or grid-like array of pixels as summarized above is common, the display 10 described herein can use other arrangements of the LEDs 18 or other systems for addressing the LEDs 18 can be used without varying from the scope of the present disclosure.

Contrast Mask

In an example, the display 10 includes one or more structures configured to enhance contrast between light being emitted from the LEDs 18 and the appearance of dark or black in the display image, also referred to simply as "contrast-enhancing structures," in order to improve one or more of visibility, readability, or overall appearance of the display image. Contrast-enhancing structures can be made from a material that is dark, such as a black material, or can be died or otherwise colored to be a dark color, such as black, to cover up or interference with areas around one or more LED packages associated with each pixel 22 that might otherwise reflect or distort light being emitted from the pixels 22. The one or more contrast-enhancing structures can, for example, reduce reflection or distortion of light emitted from the pixels 22 to reduce the occurrence of a halo effect around individual pixels 22 or LEDs 18, e.g., by minimizing or eliminating the occurrence of the halo effect. The one or more contrast-enhancing structures can also improve viewability of the display 10 and the display image in produces when the display 10 is exposed to bright and direct light onto the display surface 16, such as when sunlight shines on the display 10. For example, the one or more contrast-enhancing structures can also shade one or more corresponding LEDs 18 from direct sunlight or other bright lighting, which can prevent or reduce glare off the LEDs 18, which is known to interfere with projection of a true color from the LEDs 18.

FIGS. 1 and 2 show an example of one or more contrast-enhancing structures in the form of a contrast mask 24, also referred to as a face cover 24 that is placed onto the front face 20 of each display module 12. In addition to enhancing contrast for the LEDs 18, the contrast mask 24 can also provide protection for one or more of the LEDs 18, the display surface 16, and the electrical components of the display modules 12.

As discussed above, the spacing between adjacent pixels 22 on the display 10, also referred to as the "pixel pitch," is inversely related to the pixel density and overall resolution of the display 10. The trend in the industry of display modules is toward smaller and smaller pixel pitches to provide for the display of sharper and sharper display images that include smaller and smaller image features, much like similar trends in television technology (e.g., from standard definition to 720p high definition to 1080p high definition to ultra-high definition television such as 4K UHD and 8K UHD) and digital camera technology (e.g., to higher and higher sensor resolutions). Therefore, customers of large-scale LED displays provide a great deal of demand for smaller and smaller pixel pitches and the LED display module industry has a strong motivation to make displays with smaller and smaller pixel pitches.

As will be appreciated, the smallest sizes that are possible for the pixel pitch depend on the technology available in several technical fields. For example, the size of the pixel pitch depends to a large degree on how small the individual components can be made (e.g., the LEDs 18 and the LED packages) while still providing for desired specifications (such as brightness, color density, color range, power usage, typical component lifetime, and expected component reliability) and how closely the components can be spaced and still operated at those desired specifications (e.g., whether there are manufacturing techniques that can mount the components close enough together on a circuit board to achieve a smaller pixel pitch). Through advancements in these technologies, the smallest pixel pitch that is reliably achievable for large-scale LED displays has been reduced from about 4 millimeters ("mm") in 2012 to 2.5 mm or less in 2018.

While advancement in LED technology, supporting electronics technology, and manufacturing techniques have made smaller and smaller pixel pitches reliably possible, this shrinking of pixel pitch distances has led to other challenges. For example, very small pixel pitches, e.g., those smaller than about 4 mm and particularly those that are 2.5 mm or less, can make it difficult to fit contrast-enhancing structures between adjacent pixels 22, e.g., between the LED packages that form the pixels 22. It has also been difficult to reliably secure the contrast-enhancing structures to the display module 12. When the pixel pitch is larger, such as 5 mm or greater, then contrast-enhancing structures typically have been manufactured separately from the display module, such as by molding a plastic face cover or louver structure that is then snapped onto or otherwise secured to the display module. This type of separately formed contrast-enhancing structure is also referred to as a "secondary part" or a "secondary contrast structure." However, with smaller pixel pitch spacing (e.g., 4 mm or less, and in particular 2.5 mm or less), it becomes difficult or impossible to make secondary contrast structures by conventional manufacturing methods (e.g., injection molding or other molding techniques) because the sizes of some features of such a secondary contrast structure are simply too small to be made reliably and predictably via conventional methods.

The present disclosure describes a contrast-enhancing structure that avoids this problem with secondary contrast structures by making one or more contrast-enhancing structures that are molded directly onto the display module, such as by being molded directly onto a circuit board onto which the LEDs or LED packages are mounted. The inventors of the subject matter of the present disclosure have discovered that forming one or more contrast-enhancing structures by molding, and in particularly by molding directly onto a circuit board or other electronics-supporting structure can allow the one or more contrast-enhancing structures to be made small enough to fit between LEDs or LED packages that are mounted to the circuit board so that adverse effects associated with the light being emitted from the LEDs, such as the distortion or glare described above, can be minimized even on a display with small or very small pixel pitches, such as 4 mm or less, and in particular 2.5 mm or less.

Figures 3, 4:
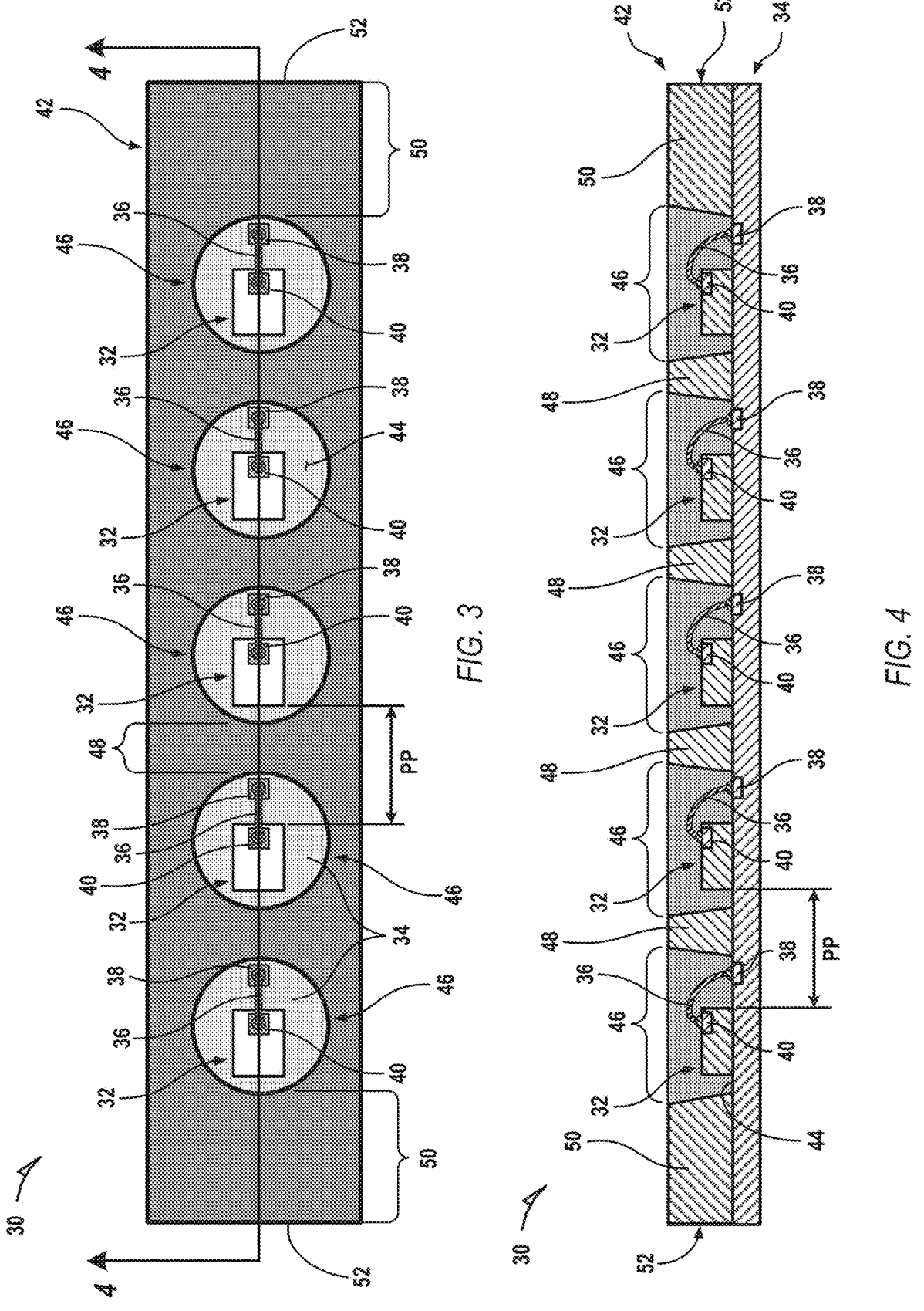
FIG. 3 is an elevation view of an example display module that includes a contrast mask molded directly to a front surface of a circuit board of the display module.
FIG. 4 is a cross-sectional side view of the example display module of FIG. 3 taken along line 4-4 in FIG. 3.

FIG. 3 shows a top view of a portion of an example display module 30 that incorporates the concepts of a directly molded contrast-enhancing structure or structures summarized above. FIG. 4 shows a cross-sectional side view of the display module 30 shown in FIG. 3. As shown in FIGS. 3 and 4, the display module 30 includes a plurality of packages 32 arranged in an array, such as a linear array shown in FIG. 3. Each package 32 includes one or more light-emitting elements, such as one or more LEDs (not shown), and can also include at least a portion of the supporting electronics for powering and controlling the one or more light-emitting elements, such as drivers, control circuitry, and the like. As described above, at the time of filing, LEDs were the most common type of light-emitting technology used for light-emitting elements in this type of display module and, therefore, the packages 32 will be referred to as "LED packages 32" for the sake of clarity, although the packages 32 are not limited to LED technology. In this way, FIGS. 3 and 4 can be thought of as showing a close-up view of a portion of a larger display surface of the display module 30 (similar to the display surface 16 for the display 10 of FIGS. 1 and 2), for example a portion of one row of pixels that make up the display surface.

In an example, each LED package 32 includes all of the LEDs that make up a single pixel within the display module 30, similar to the pixels 22 of LEDs 18 described above for the display 10 in FIGS. 1 and 2. For example, if the display module 30 is designed so that each pixel comprises one red LED, one green LED, and one blue LED, than in an example each LED package 32 includes three (a red LED, a green LED, and a blue LED). Each LED package 32 can also include at least a portion of the supporting electronics that provide for the emission of light from the LEDs on the LED package 32, such as LED drivers or other electronic components to allow the red LED to emit red light, the green LED to emit green light, and the blue LED to emit blue light. The LED packages 32 are electrically mounted to an electronics-support structure 34, such as a printed circuit board 34 (referred to simply as "the circuit board 34" hereinafter for brevity). The circuit board 34 can also include other structures that have been pre-formed or pre-mounted onto the surface of the circuit board 34 or pre-formed within or through the circuit board 34, for example supporting electronics for the LED packages 32 or conducting traces for transmission of signals or power to or from the LED packages 32 (not shown in FIGS. 3 and 4).

In examples where each LED package 32 corresponds to a pixel of the display module 30 (e.g., with each LED package 32 including a red LED, a green LED and a blue LED), than the LED packages 32 are mounted to the circuit board 34 at specified positions on the circuit board 34 corresponding to the desired spacing between the pixels of the display module 30. In other words, the LED packages 32 are mounted to the circuit board 34 so that the LED packages 32 are spaced by a specified pixel pitch, designated as "PP" in FIGS. 3 and 4.

In the example shown in FIGS. 3 and 4, each LED package 32 is electrically coupled to the circuit board 34 via one or more wires 36 or other electrical connection that are each electrically connected to a corresponding connection pad 38 on the circuit board 34 and a corresponding connection pad 40 on the LED package 32. Each connection pad 38 on the circuit board 34 can be electrically connected to supporting electronics, such as a controller, via one or more electrically connection, such as electrical traces on the circuit board 34 (not shown). Each connection pad 40 can be electrically connected to one or more electronic devices in the LED package 32, such as one or more of the LEDs in the LED package 32 or supporting electronics for the LEDs. Each LED package 32 can also be electrically connected to the circuit board 34 via a surface mount connection in place of or in addition to the one or more wires 36, such as a back side of the LED package 32 that is electrically mounted to a corresponding surface-mount connection pad on a front surface 44 of the circuit board 34 (not shown).

Figure 5:
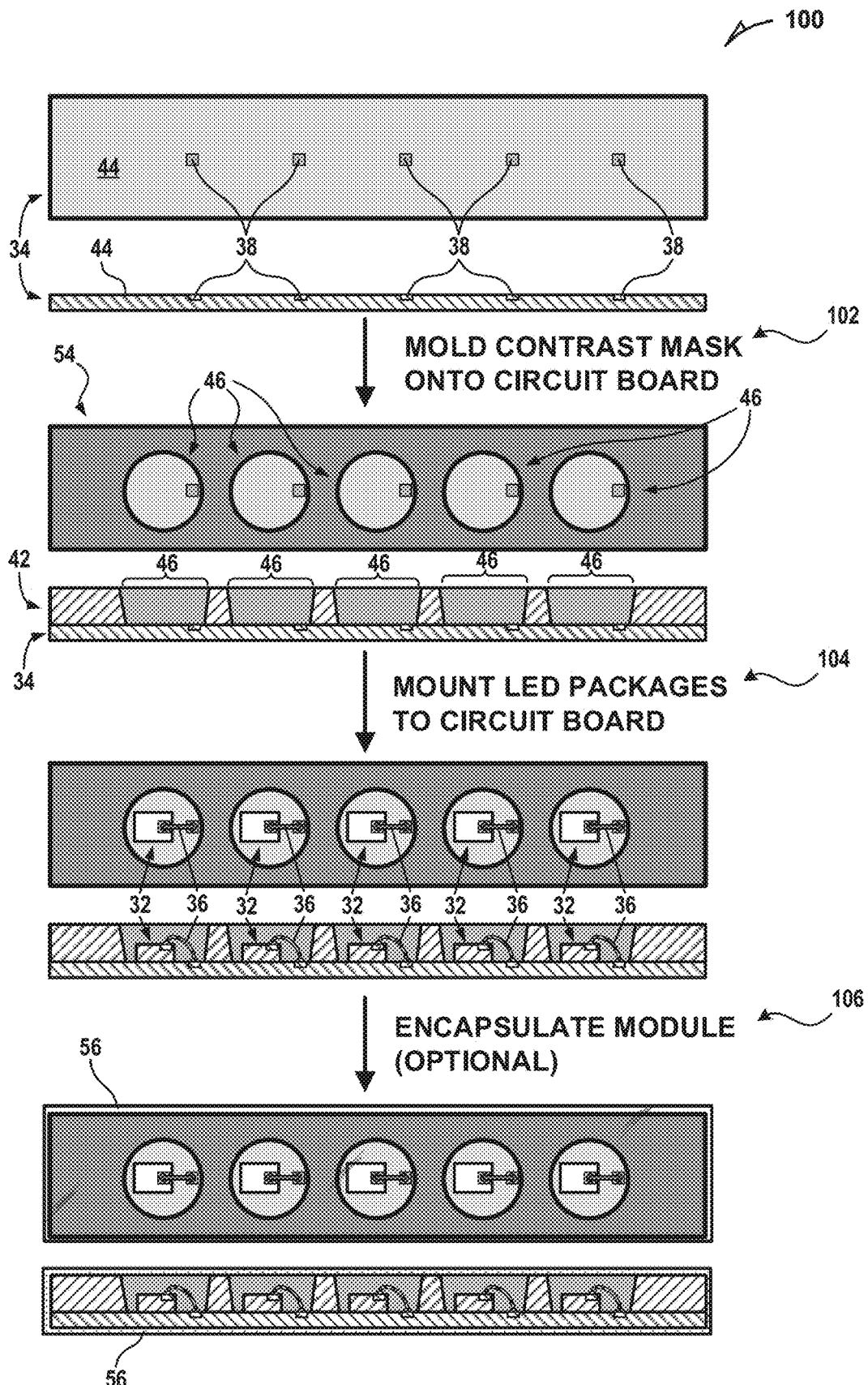
FIG. 5 is flow diagram of an example method of forming an example display module with a contrast mask molded directly to a front surface of the display module's circuit board.

The display module 30 also includes a contrast mask 42 that is directly coupled to the circuit board 34 (or to a coating or film on the surface of the circuit board 34), for example by being coupled to at least the front surface 44 of the circuit board 34. As used herein, the terms "coupled directly to," "direct coupling," and the like, when referring to a contrast mask like the example contrast mask 42 shown in FIGS. 3-5, means that at least a portion of one surface of the contrast mask is physically attached to at least a portion of one or more surfaces of the circuit board 34. Direct coupling between the contrast mask 42 and the circuit board 34 can refer to the material or materials of the contrast mask 42 being bonded (either chemically or physically) to the material or materials of the circuit board 34 at the surface of the direct coupling (e.g., wherein the contrast mask 42 is in physical contact with the circuit board 34, as shown in FIGS. 3-5), or it can refer to the material or materials of the contrast mask 42 being adhered to the surface of the circuit board 34, such as with an adhesive material, or to the material or materials of the contrast mask 42 being adhered to a coating or film on the surface of the circuit board 34.

In an example, the contrast mask 42 is molded onto at least the front surface 44 of the circuit board 34, for example by way of a molding process wherein a contrast-mask material is molded onto at least the front surface 44 in a specified geometry corresponding to one or more desired contrast-enhancing structures for the contrast mask 42, such as in the example described in more detail below with respect to FIG. 5. In the example shown in FIGS. 3 and 4, the contrast mask 42 has been molded to form a plurality of windows 46 in or through the contrast mask 42 through which the LED packages 32 and/or LED pixels and, in some examples, a portion of the circuit board 34, are exposed in a front facing direction. In this way, the plurality of windows 46 allows at least a specified portion of the light that is generated by the LEDs of the LED packages 32 to be emitted out from the LED packages 32 to provide the display image on a display surface formed from the display module 30 (possibly in conjunction and coordination with one or more other display modules positioned in proximity to the display module 30, similar to that which is described above with respect to the display 10 of FIGS. 1 and 2). Each window 46 provides a path for the emission of light from one or one or more LED packages 32 and/or to one or more pixels on the display module 30.

As used herein, the term "window" can refer to an opening that passes through the entirety of the contrast mask 42, e.g., so that a portion of the front surface 44 of the circuit board 34 is exposed (as shown in the example of FIGS. 3 and 4), or can refer to an opening where the contrast mask 42 comes into contact with the LEDs or LED packages 32 but where there is still a path for the light from the LEDs to be emitted forward from the display module 30. In other words, the "window" need not pass through the entirety of the contrast mask 42 so long as the specified portion of light generated by the LEDs is emitted forward from the LED packages 32 to provide the display image.

In the example shown in FIGS. 3 and 4, there is one window 46 in or through the contrast mask 42 corresponding to each individual LED package 32 or pixel of LEDs on the display module 30. The formation of the windows 46 in or through the contrast mask 42 results in the formation of internal walls 48 of the material of the contrast mask 42 that each separate a pair of adjacent LED packages 32, best seen in FIG. 4. Each internal wall 48 also partially defines a peripheral edge for each of the windows 46 that the internal wall 48 is between. The formation of the windows 46 also results in an external wall 50 between each outermost LED package 32 (e.g., the left-most and right-most LED packages 32 in FIGS. 3 and 4) and an outer edge 52 of the display module 30, wherein each external wall 50 separates the outermost LED package 32 from the outer edge 52 and also partially defines the peripheral edge of the window 46 around the outermost LED package 32.

As noted above, the example display module 30 shown in FIG. 3 only includes a single row of LED packages 32 to simply the illustration and the identification of structures. However, as noted above, the display module 30 of the present disclosure is not limited to a single row of LED packages 32, and could include an array of LED packages 32

(e.g., with a plurality of rows of LED packages 32 forming a grid or grid-like array of rows and columns). In examples where the display module 30 includes more than one row of LED packages 32, the contrast mask 42 can include not only the internal walls 48 that separate an LED package 32 from an adjacent LED package 32 in the same row (i.e., in the left-to-right extending row of FIG. 3), but can also include similar internal walls that separate an LED package 32 from an adjacent LED package 32 in the same column (i.e., in a direction that is generally perpendicular to the direction of the rows, such as in an up-and-down direction in FIG. 3). Similarly, in examples where the display module 30 includes more than one row of LED packages 32, the contrast mask 42 can include an external wall 50 or a series of external walls 50 that extend around the entire periphery of the contrast mask 42 and correspond only to the lateral outer-most LED packages 32 of the display module 30 (e.g., along the left-most, right-most, top-most, and bottom-most edges 52 of the display module 30).

As described in more detail below with respect to the examples shown in FIGS. 6-8, the contrast mask 42 is designed so that the windows 46 can be as small as possible while still allowing a specified amount of light to be emitted from the LED package 32 or packages 32 corresponding to each window 46. In other words, the size of the openings of the windows 46 is preferably as close as possible to the size of an individual LED package 32. The size of the openings of the windows 46 is preferably as small as possible so that the material of the contrast mask 42 covers as much of the circuit board 34 as possible in order to maximize the contrast-enhancing effect of the contrast mask 42. In this way, in some examples the contrast mask 42 covers sub-stantially all of a surface area of the front surface 44 of the circuit board 34 except for the small surface area exposed by the windows 46. However, as described above, there is substantial market pressure for a narrow pixel pitch PP, e.g., a pixel pitch PP of 4 mm or less, and preferably of 2.5 mm or less. When the spacing between adjacent LED packages 32 is this small, there is very little surface area on the front surface 44 of the circuit board 34 dedicated to each LED package 32. It can be very difficult to fit all of the structures of the display module 30 onto this limited surface area—including the LED packages 32 themselves, structures for electrical connection between the LED packages 32 and the circuit board 34, e.g., the wires 36 and the connection pads 38, and the structure of the contrast mask 42, e.g., the internal walls 48 and the external walls 50, as well as any other supporting electronics for the LED packages 32.

FIG. 5 is a flow diagram of an example method 100 of manufacturing a display module having a contrast mask molded directly to the circuit board or another electronics-supporting structure, for example, the contrast mask 42 molded to the circuit board 34 of the display module 30 shown in FIGS. 3 and 4. Each set of drawings in FIG. 5 shows a top view and a cross-sectional side view of the structure at a particular stage of the process.

In an example, the method 100 includes providing or receiving an electronics-mounting structure, such as the circuit board 34 (represented by the top two structures in FIG. 5). In an example, the circuit board 34 that is provided or received can include a main circuit board body, and one or more electrical-connecting structures such as the connec-tion pads 38, that can be pre-formed on the circuit board 34 before the subsequent processing steps described below. The circuit board 34 can also include one or more connection pathways (not shown) to electrically connect the one or more connection pads 38 to one or more other structures or devices (not shown) to enable operation of the LED packages 32

Next, the method 100 can include, at step 102, molding a moldable material onto a front surface 44 of the circuit board 34 in order to form a contrast mask 42. In an example, the moldable material comprises a moldable polymeric material, such as an elastomeric polymer or a thermoplastic polymer. The moldable material that is used to form the contrast mask 42 can comprise any material that will reliably bond or adhere to the circuit board 34 (e.g., onto the front surface 44 of the circuit board 34), and can be selected to have one or more specified properties once the moldable material is formed into and sets as the contrast mask 42. Examples of specified material properties include, but are not limited to: a specified hardness when set; a specified glass-transition temperature; a specified compressibility; a specified impact strength; and a specified coefficient of thermal expansion ("CTE"), such as a CTE that matches or substantially matches the CTE of the circuit board 34 (within a specified threshold) so that the circuit board 34 and the contrast mask 42 will expand and contract at the same or substantially the same rate as the display module 30 experiences changes in temperature during use.

Examples of the moldable material that can be applied by the step of contrast mask molding 102 include, but are not limited to: an epoxy-based compound such as EME-G770SF epoxy sold by Sumitomo Bakelite; a silicone-based compound such as OE-6650 silicone encapsulant sold by Dow Corning, or a black carbon compounds such as MONARCH 800 Carbon Black sold by Cabot Corp.

The step of contrast mask molding 102 provides a coated circuit board 54, wherein at least a portion of the front surface 44 of the circuit board 34 has been coated with the moldable material to form the contrast mask 42. In an example, the step of contrast mask molding 102 includes shaping the moldable material to form specified features of the contrast mask 42, including windows 46 (described above), so that the features have a specified geometry, including specified dimensions and sizes (including, but not limited to, those described with respect to the examples described in FIGS. 6-8).

Any manufacturing technique that can produce the contrast mask 42 with the specified features and specified geometries can be used for the step of the contrast mask molding 102. A non-limiting example of a molding technology that has been found to be useful when the display module 30 is desired to have a narrow pixel pitch PP, e.g., about 4 mm or less, preferably about 2.5 mm or less, is film-assisted molding technology, or "FAM." FAM has been found to be useful in forming the structures of the contrast mask 42 on the small scale that is necessary for a narrow pixel pitch PP (e.g., of 4 mm or less, preferably about 2.5 mm or less) during the molding step 102.

In an example, FAM of the contrast mask 42 can include providing or receiving a mold having a mold cavity with an inner surface geometry that corresponds to the desired outer geometry of the contrast mask 42 (e.g., the inner surfaces of the mold cavity are a reverse-image version of the outer surfaces of the contrast mask 42). Next, a thin film liner is placed into the mold against the inner surfaces of the mold cavity. The thin film liner is heated to at least partially melt or soften the thin film liner and a vacuum is applied to the at least partially melted or softened thin film liner to suck the thin film liner tightly onto the inner surfaces of the mold cavity. Then, the circuit board 34 is placed in the mold cavity at a specified position relative to the lined inner surfaces of the mold cavity and the mold cavity is closed. A liquid or softened form of the moldable material that will form the contrast mask 42 is then injected into the mold cavity so that the moldable material can flow over the circuit board 34 and within the free space within the mold cavity to form the specified geometry of the contrast mask 42. The liquid or softened form of the moldable material is injected with sufficient velocity and force so that it will flow into all the free spaces within the mold cavity, e.g., so that there is little to no undesired unfilled space within the mold cavity. In some examples, the injection of the moldable material can be vacuum assisted, e.g., with a vacuum applied to the mold cavity so that moldable material will more readily fill the open space within the mold cavity. Application of the vacuum can also assist in the extraction of air bubbles or other gas that may be trapped in the liquid or softened moldable material to minimize or eliminate the formation of small voids in the final contrast mask 42.

After the liquid or softened moldable material has been sufficiently injected into the mold cavity, the moldable material is either actively set or cured or is allowed to passively set or cure (e.g., to solidify) into the solidified contrast mask 42. In an example, additional heat or pressure, or both, can be applied to the mold to drive solidification of the moldable material into the solid material of the contrast mask 42 and to provide for more uniform and controllable curing of the material into the solid contrast mask 42. In examples where a vacuum is applied to the mold cavity to provide for evacuation of trapped air or other gasses from the liquid or softened moldable material, as described above, in some examples the vacuum can continue to be applied to the mold cavity while the material solidifies to continue to evacuate trapped air and other gasses and to minimize or prevent the possibility of gas diffusing into the moldable material during the curing process. After the moldable material has cured to a specified solidification value, e.g., to a desired hardness within a specified threshold, then the mold cavity is opened and the now coated circuit board 54 with the molded contrast mask 42 is removed from the mold cavity. In FAM methods, the used thin film liner can be removed from the inner surfaces of the mold cavity and can be replaced by a fresh thin film liner, which is placed into the mold cavity, heated, and sucked onto the inner surfaces of the mold cavity for the coating of a different circuit board 34 with the moldable material to form another contrast mask 42.

The method 100 includes, at step 104, electrically mounting a plurality of LEDs to the circuit board 34, such as within the windows 46 in the contrast mask 42. In the example shown in FIG. 5, the mounting 104 of the LEDs or the LED packages 32 onto the circuit board 34 is performed after molding 102 the contrast mask 42 onto the circuit board 34. In examples where one or more of the LEDs are included as part of an LED package 32, as described above, than step 104 includes electrically mounting a plurality of the LED packages 32 to the circuit board 34, such as by mounting one or more corresponding LED packages 32 in each window 46 in the contrast mask 42. In an example, the mounting of the LEDs or LED packages 32 includes coupling the LED packages 32 to the front surface 44 of the circuit board 34 (e.g., by welding or adhering a bottom surface of each LED package 32 to the front surface 44) and electrically connecting wires 36 or other electrical connecting structures between one or more connection pads 38 on the circuit board 34 and one or more corresponding connection pads 40 on each LED package 32 (best seen in FIGS. 3 and 4). In some examples, the mounting 104 of the LEDs or LED packages 32 to the circuit board 34 can be performed before the step of molding 102 the contrast mask 42 to the circuit board 34 (e.g., the order of steps 102 and 104 can be reversed with respect to what is shown in FIG. 5).

Optionally, the method 100 can include, at step 106, encapsulating the coated circuit board 54 and the LED packages 32 with an encapsulation cover 56 to separate and seal an external environment from the circuit board 34, the LED packages 32, the wires 36 or other electrically connections, and any other electronic structures or components. The encapsulation cover 56 can comprise a transparent or substantially transparent material so that the encapsulation cover 56 does not interfere with the light being emitted from the display module. In particular, the encapsulation cover 56 can be useful when the display module 30 is to be used in an exterior environment where the display module 30 will be exposed to weather, and in particular to moisture in the air or in the form of precipitation. Examples of materials that can be used to form the encapsulation cover 56 include, but are not limited to, silicone-based materials or polyurethane-based materials, such as the silicone electronics encapsulants manufactured by Dow Corning Corp., Midland, Mich., USA, such as the Dow Corning EE-1184 silicone encapsulant. Further details of an example method that can be used to form the encapsulation cover 56 are provided in U.S. Pat. No. 9,172,929 B2 to Mutschelknaus et al., entitled "ENCAPSULATION OF LIGHT-EMITTING ELEMENTS ON A DISPLAY MODULE," and in U.S. application Ser. No. 15/141,525 to Mutschelknaus et al., filed on Apr. 28, 2016, entitled "ENCAPSULATION OF LIGHT-EMITTING ELEMENTS ON A DISPLAY MODULE," which published as U.S. Published Application No. 2016/0247983 A1 on Aug. 25, 2016, the disclosures of which are incorporated by reference as if reproduced herein in their entireties.

As noted above, the geometry of the contrast mask 42 is selected so that the windows 46 allow the light emitted from the LEDs of the LED packages 32 to pass outward (e.g., forward) from the display module 30 in order to show the intended display image or video on the display surface of the display, but also so that the contrast mask 42 will maximize coverage of the circuit board 34 in order to maximize contrast enhancement on the display module 30. The geometry that can achieve these goals may depend on the layout of the LEDs on the circuit board 34. FIGS. 6 and 7 show an example LED package 60 mounted to an example circuit board 62. The LED package 60 and the circuit board 62 can be examples of the LED packages 32 and the circuit board 34 that are used in the display module 30 shown in FIGS. 3-5.

Figure 6:
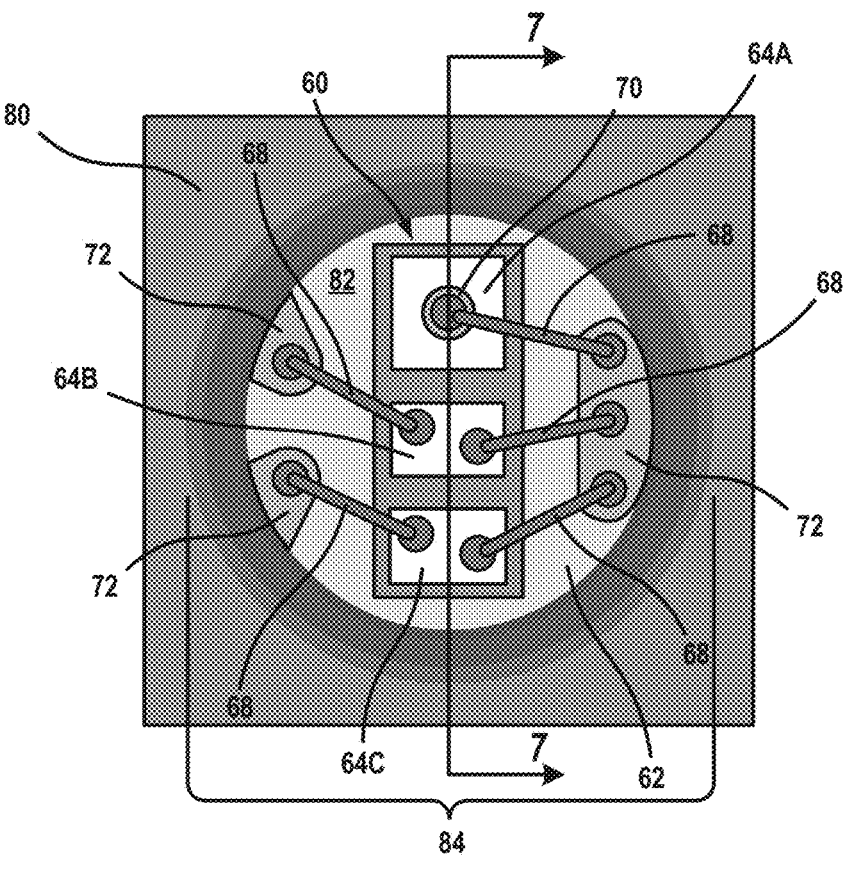
FIG. 6 is a close-up elevation view of an example package of a plurality of light-emitting elements for a display module with a contrast mask directly molded to the front surface of a circuit board of the display module.

In the example shown best in FIG. 6, the LED package 60 comprising three LEDs, in this example a first LED 64A (shown as a red LED 64A), a second LED 64B (shown as a green LED 64B), and a third LED 64C (shown as a blue LED 64C), which will be collectively referred to as "LED 64" or "LEDs 64" for brevity. The examples LEDs 64 are so-called "surface-mount" LEDs 64, wherein at least a portion of a rear surface of the LED 64 is soldered directly to the circuit board 62. In some examples, a solder joint (not shown) between the rear surface of the LED 64 and the circuit board 62 also provides an electrical connection between the LED 64 and a corresponding connection pad 66A, 66B, 66C on the circuit board 62 (best seen in FIG. 7). For example, the solder joints can provide an electrical connection between the first LED 64A and a first connection pad 66A, between the second LED 64B and a second connection pad 66B, and between the third LED 64C and a third connection pad 66C. In some instances, the connection pads 66A, 66B, 66C will be referred to collectively as the "connection pad 66" or "connection pads 66" for brevity. Additional electrical connections to the LEDs 64 can be provided via wires 68 or other conductors that electrical connect one or more wire connection pads 70 on the LEDs 64 with one or more corresponding wire connection pads 72 on the circuit board 62.

A contrast mask 80 is coupled directly the circuit board 62 (similar or substantially the same as described above with respect to the contrast mask 42 on the circuit board 34). Like the contrast mask 42 described above with respect to FIGS. 3-5, in some examples the contrast mask 80 is molded onto at least a front surface 82 of the circuit board 62 and includes a plurality of windows 84 (with only one window 84 being shown in FIG. 6 and with only a portion of two adjacent windows 84 shown in the cross-sectional view of FIG. 7). Each window 84 provides an opening in the contrast mask 68 through which light from the LEDs 64 can be emitted, with each window 84 corresponding to one or more of the LED packages 60. The contrast mask 80 is also formed into one or more structures that define the windows 84, such as one or more walls 96 that surround and define a window 84 (best seen in the cross-sectional view of FIG. 7).

As is best seen in FIG. 6, the LEDs 64 of the LED package 60 are arranged in a specified pattern that is selected to provide for a desired emission of the light in order to produce the display image on the display of which the display module is a part. In the example shown in FIGS. 6 and 7, the specified pattern of the LED package 60 is a generally linear arrangement, with each of the LEDs 64 aligned substantially in the same direction (e.g., in a generally up-and-down arrangement with respect to the display surface and the display image). The sizing and shape of the windows 84 in the contrast mask 80 can be selected to accommodate the configuration of the LEDs 64, as well as to accommodate the locations of the wire connection pads 72 located on the circuit board 62 and to allow for placement and the securing of the wires 68 to the wire connection pads 70 and 72 within the space of the window 84.

As described above, the sizing and geometry of the windows 84 is preferably selected so that the pixel pitch PP between the LED package 60 and an adjacent LED package 60 is as small as possible, preferably 4 mm or less, still more preferably 2.5 mm or less. For this reason, those of skill in the art will appreciate that the specific configuration of the components of the LED package 60 and the circuit board 62 can be modified from that which is shown in FIGS. 6 and 7 in order to achieve a desired pixel pitch PP as well as to provide for a contrast mask 80 that provides for a desired contrast for the LEDs 64. For example, those of skill in the art can envision modifying one or more of: the overall cross-sectional shape of the LED package 60, the general arrangement of the LEDs 64 with respect to one another on the LED package 60, or the positioning of the wire connection pads 72 relative to the LED package 60 and to specific LEDs 64. FIGS. 8A, 8B, and 8C show three examples of different configurations that have been contemplated by the inventors of the subject matter of the present disclosure. FIG. 8A shows a first example of an LED package 160 with LEDs 164A, 164B, and 164C that are arranged in a more bunched configuration, with the red LED 164A in a top-most position, the green LED 164B positioned below the red LED 164A and aligned in a substantially vertical orientation, and with the blue LED 164C positioned laterally beside both the red and green LEDs 164A, 164B and also aligned in a substantially vertical orientation. FIG. 8A also shows examples of wire connection pads 172 and their position relative to the various LEDs 164A, 164B, and 164C of the LED package 160, with the LEDs 164A, 164B, and 164C being electrically connected to the wire connection pads 172 with electrical conductors, such as wires 68.

FIG. 8B shows a second example of an LED package 260 that is also in a bunched configuration, but with the overall orientation of the LED package 260 being in a generally horizontal orientation with the red LED 264A one lateral side of the LED package 260 (e.g., a left-most side in FIG. 8B) and with the green LED 264B and the blue LED 264C positioned on the other later side of the LED package 260 (e.g., the right-most side in FIG. 8B) and with both the green and blue LEDs 264B and 264C being aligned in a substantially vertical orientation. FIG. 8B also shows examples of wire connection pads 272 and their position relative to the various LEDs 264A, 264B, and 264C of the LED package 260. Like the LED package 160 of FIG. 8A, the LEDs 264A, 264B, and 264C of the LED package 260 can be electrically connected to the wire connection pads 272 with electrical conductors, such as wires 68.

FIG. 8C shows a third example of an LED package 360 that includes the LEDs arranged in an angled configuration, e.g., with each of the LEDs 364A, 264B, and 364C being angled at a 45° angle relative to the orientation of the display module, with the red LED 364A on one lateral side of the LED package 360 (e.g., on the left side in FIG. 8C) and the green LED 364B and the blue LED 364C each being on an opposite lateral side of the LED package 360 (e.g., on the right side in FIG. 8C) and extending away from the red LED 364A at 450 with respect to the red LED 364A and at 90° with respect to one another. FIG. 8C also shows examples of wire connection pads 372 and their position relative to the various LEDs 364A, 364B, and 364C of the LED package 360. Like the LED packages 160 and 260 of FIGS. 8A and 8B, the LEDs 364A, 364B, and 364C of the LED package 360 can be electrically connected to the wire connection pads 372 with electrical conductors, such as wires 68.

Figure 7:
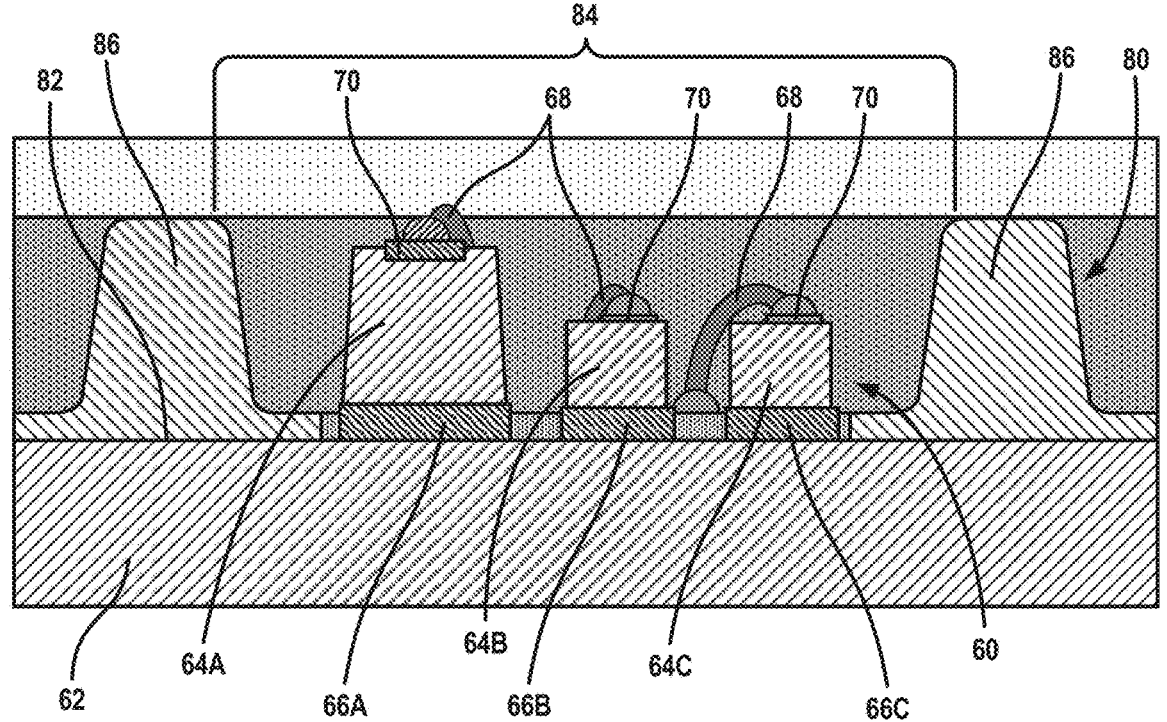
FIG. 7 is a cross-sectional side view of the example package and the example contrast mask of FIG. 6 taken along line 7-7 in FIG. 6.
Figures 8A, 8B, 8C:
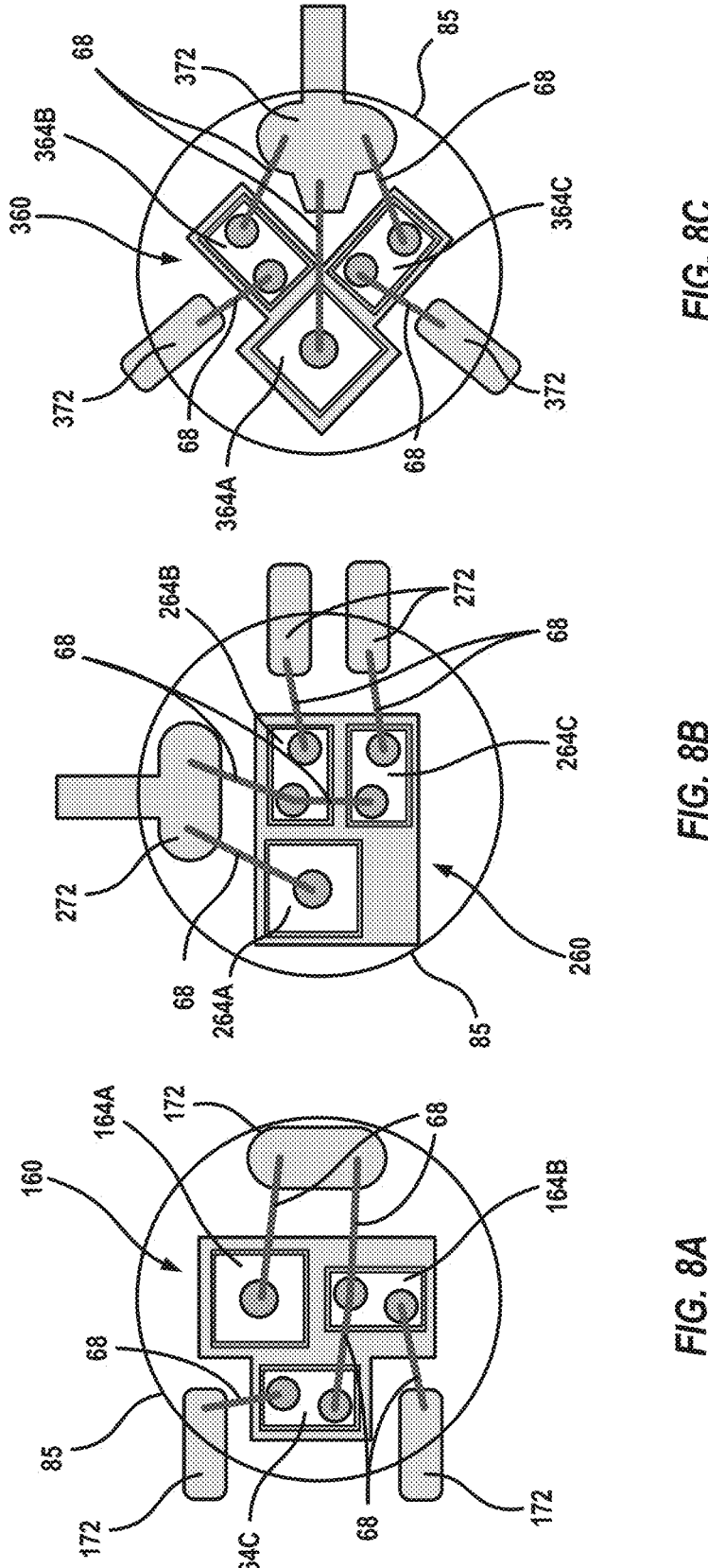
FIGS. 8A, 8B, and 8C are elevation views of example packages of light-emitting elements having various example configurations.

FIGS. 8A-8C each also show an outline 85 representing the outer border of the window formed by a contrast mask (e.g., of the window 84 in the contrast mask 80 in the example of FIGS. 6 and 7). The outline 85 shows the position of the LED packages 160, 260, 360 within the window of the contrast mask as well as what portions of the wire connection pads 172, 272, and 372 would be exposed by the windows (e.g., that are not covered by the contrast mask) and therefore would be available for a welding device to connect the wires 68 between the LED packages 160, 260, 360 and the wire connection pads 172, 272, 372.

The configurations of the LED packages 60, 160, 260, and 360 and of the wire connection pads 72, 172, 272, 372 shown in FIGS. 6, 7, 8A, 8B, and 8C are intended only to provide examples so that the person of ordinary skill in the art will be able to understand the concepts of the inventions disclosed herein. Those of skill in the art will appreciate that the configurations shown in FIGS. 6, 7, 8A, 8B, and 8C are merely intended as examples, and not as a limiting or exhaustive list of the potential configurations that could be used for the LEDs, wire connection pads, or the LED packages. Similarly, those of skill in the art will appreciate that the orientations of the LED packages shown in FIGS. 6, 8A, 8B, and 8C (e.g., generally vertical, generally horizontal, or generally at a 45° angle relative to horizontal and vertical) are not limiting, and those of skill in the art will be able to contemplate rotating any of the configurations of any individual component or groups of components at any angle relative to that which is shown in FIGS. 6, 8A, 8B, and 8C without varying from the scope of the present disclosure.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:

providing or receiving a circuit board comprising a front surface and a plurality of contact pads on the front surface, wherein each of the plurality of contact pad is electrically connected to one or more conducting traces on the front surface;

directly molding a polymeric material onto at least a portion of the conducting traces or the contact pads, or both, and a portion of the front surface of the circuit board;

wherein the direct molding of the polymeric material forms a contrast mask that covers at least the portion of the conducting traces or the contact pads, or both, and the portion of the front surface;

mounting a plurality of light-emitting elements onto the front surface of the circuit board in an array configured to produce at least a portion of a display image at the front surface of the circuit board; and electrically connecting the plurality of the light-emitting elements to the plurality of the contact pads so that the plurality of light-emitting elements are electrically connected to the conducting traces;

wherein the direct molding of the polymeric material comprises forming a plurality of windows in or through the contrast mask to allow for emission of light from the light-emitting elements to produce a display image at the front surface of the circuit board, wherein each window surrounds a group of one or more of the plurality of light-emitting elements.

2. The method of claim 1, wherein each group of one or more of the plurality of light-emitting elements comprises a pixel of two or more of the light-emitting elements, wherein a plurality of the pixels is arranged to provide the array.

3. The method of claim 2, wherein the mounting of the plurality of light-emitting elements comprises mounting adjacent pixels of the plurality of pixels so that the adjacent pixels are spaced apart by a specified pixel pitch.

4. The method of claim 3, wherein the specified pixel pitch is no larger than 4 millimeters.

5. The method of claim 3, wherein the specified pixel pitch is no larger than 2.5 millimeters.

6. The method of claim 2, wherein the contrast mask reduces occurrence of a halo effect around one or more of the pixels.

7. The method of claim 2, wherein the contrast mask enhances contrast between light being emitted by the light-emitting elements and an appearance of dark or black in the display image.

8. The method of claim 1, wherein the direct molding of the polymeric material onto at least the portion of the conducting traces or the contact pads, or both, and the portion of the front surface of the circuit board precedes one or both of: the mounting of the plurality of light-emitting elements onto the front surface of the circuit board, and the electrical connecting of the plurality of the light-emitting elements to the plurality of the contact pads.

9. The method of claim 1, wherein the direct molding of the polymeric material onto at least the portion of the conducting traces or the contact pads, or both, and the portion of the front surface of the circuit board is after one or both of: the mounting of the plurality of light-emitting elements onto the front surface of the circuit board, and the electrical connecting of the plurality of light-emitting elements to the plurality of the contact pads.

10. The method of claim 1, wherein the polymeric material comprises at least one of: an epoxy-based polymer, a silicone-based polymer, or a black carbon polymer.

11. The method of claim 1, wherein the polymeric materials comprises a thermoplastic polymer.

12. The method of claim 2, wherein the direct molding of the polymeric material to form the contrast mask comprises forming walls of the polymeric material that surround and separate each pixel and define the plurality of windows.

13. The method of claim 1, wherein the direct molding of the polymeric material to form the contrast mask comprises:
   directly molding a liquid or softened form of the polymeric material onto the circuit board so that that the liquid or softened form of the polymeric material covers at least the portion of the conducting traces or the contact pads, or both, and the portion of the front surface of the circuit board; and
   setting or curing the liquid or softened form of the polymeric material to form solid polymeric material of the contrast mask.

14. The method of claim 1, wherein the direct molding of the polymeric material to form the contrast mask comprises film-assisted molding of the polymeric material onto at least the portion of the conducting traces or the contact pads, or both, and the portion of the front surface of the circuit board.

15. The method of claim 2, wherein each pixel comprises a package comprising the two or more of the light-emitting elements that make up the pixel and supporting electronics that provide for emission of light from the two or more of the light-emitting elements that make up the pixel, wherein a corresponding window formed during the direct molding of the polymeric material surrounds the package so that light emitted by the two or more of the light-emitting elements of the package is emitted through the corresponding window,
   wherein the mounting of the two or more of light-emitting elements of the package onto the front surface of the circuit board comprises mounting the package onto the front surface of the circuit board, and
wherein electrically connecting the two or more of the light-emitting elements of the package comprises electrically connecting one or more of the contact pads to one or more corresponding electrical contacts on the package.

16. The method of claim 14, wherein the film-assisted molding comprises:
   providing or receiving a mold having a mold cavity with one or more inner surfaces forming an inner surface geometry that corresponds to an outer surface geometry of the contrast mask, wherein the inner surface geometry provides for covering of at least the portion of the conducting traces or the contact pads, or both, and the portion of the front surface of the circuit board;
   positioning a thin film liner within the mold cavity along the one or more inner surfaces;
   deforming the thin film liner tightly onto the one or more inner surfaces to provide one or more film-lined interior surfaces of the mold cavity, wherein the one or more film-lined interior surfaces have the inner surface geometry;
   positioning the circuit board in the mold cavity at a specified position relative to the one or more film-lined interior surfaces;
   injecting a liquid or softened form of the polymeric material into the mold cavity so that the liquid or softened form of the polymeric material forms the outer surface geometry of the contrast mask and covers at least the portion of the conducting traces or the contact pads, or both, and the portion of the front surface of the circuit board;
   setting or curing the liquid or softened form of the polymeric material to form solid polymeric material in the form of the contrast mask having the outer surface geometry.

17. The method of claim 16, wherein the deforming of the thin film liner comprises one or both of: heating the thin film liner to at least partially melt or soften the thing film liner, and applying a vacuum to the mold to suck the thin film liner tightly onto the one or more inner surfaces of the mold cavity.

18. The method of claim 16, wherein an injection velocity of the liquid or softened form of the polymeric material is sufficiently high during the injecting of the liquid or softened form of the polymeric material that the liquid or softened form of the polymeric material will substantially fill all free space within the mold cavity.

19. The method of claim 16, further comprising applying a vacuum to the mold cavity during one or both of: the injecting of the liquid or softened form of the polymeric material into the mold cavity, and the setting or curing of the liquid form of the polymeric material to form the solid polymeric material of the contrast mask.

* * * * *